US010159168B2

(12) United States Patent
Jung et al.

(10) Patent No.: US 10,159,168 B2
(45) Date of Patent: Dec. 18, 2018

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Minsu Jung, Asan-si (KR); Byungchan Kim, Yongin-si (KR); Hyunsu Park, Hwaseong-si (KR); Sung-hun Lee, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/336,962

(22) Filed: Oct. 28, 2016

(65) Prior Publication Data

US 2017/0325364 A1 Nov. 9, 2017

(30) Foreign Application Priority Data

May 4, 2016 (KR) .................. 10-2016-0055594

(51) Int. Cl.
  *H05K 7/20* (2006.01)
  *G02F 1/1333* (2006.01)
  *H05K 1/02* (2006.01)

(52) U.S. Cl.
  CPC ... *H05K 7/20954* (2013.01); *G02F 1/133308* (2013.01); *G02F 1/133382* (2013.01); *G02F 2001/133317* (2013.01); *G02F 2202/28* (2013.01); *H05K 1/0212* (2013.01); *H05K 2201/10136* (2013.01)

(58) Field of Classification Search
  CPC ........ H05K 2201/10128; H05K 1/0212; G02F 2001/133317; G02F 2202/28
  See application file for complete search history.

(56) References Cited

U.S. PATENT DOCUMENTS

| 2008/0111943 | A1* | 5/2008 | Kim ..................... G02B 6/0083 349/60 |
| 2012/0162880 | A1* | 6/2012 | Yoon ....................... H04N 5/64 361/679.01 |
| 2014/0375891 | A1* | 12/2014 | Hosoki ............. G02F 1/133308 348/725 |
| 2016/0279862 | A1* | 9/2016 | Larsen ..................... B26F 3/12 |

FOREIGN PATENT DOCUMENTS

| KR | 10-2014-0020157 A | 2/2014 |
| KR | 10-2014-0060078 A | 5/2014 |
| KR | 10-2014-0137131 A | 12/2014 |

* cited by examiner

*Primary Examiner* — Hoa C Nguyen
(74) *Attorney, Agent, or Firm* — Lee & Morse P.C.

(57) ABSTRACT

A display device includes a display panel including a top surface and a bottom surface facing the top surface in a normal direction, a mold member including a seat surface and an outer surface, the bottom surface of the display panel being positioned on the seat surface of the mold member, an adhesion member between the bottom surface and the seat surface to fix the bottom surface to the seat surface, a heating wire contacting the adhesion member, and an accommodation member coupled to the mold member.

19 Claims, 11 Drawing Sheets

DISPLAY DEVICE AND METHOD FOR MANUFACTURING THE SAME

CROSS-REFERENCE TO RELATED APPLICATIONS

Korean Patent Application No. 10-2016-0055594, filed on May 4, 2016, in the Korean Intellectual Property Office, and entitled: "Display Device and Method for Manufacturing the Same," is incorporated by reference herein in its entirety.

BACKGROUND

1. Field

The present disclosure herein relates to a display device, and more particularly, to a display device including a heating wire softening an adhesion member disposed between a display panel and a mold member, and a method for manufacturing the same.

2. Description of the Related Art

Electronic equipment, e.g., mobile communication terminals, digital cameras, laptop computers, and televisions, include, display devices to display an image. These display devices include, e.g., liquid crystal display devices, organic light emitting display devices, and plasma display devices.

For example, a display device may include a display panel for displaying an image, and a backlight unit for providing light to the display panel. The backlight unit includes a light source for emitting light and an optical member.

Also, the display device includes a mold member and an accommodation member. The accommodation member accommodates the optical member, the display panel, and the mold member. The mold member supports the optical member and the display panel and is coupled to the accommodation member. This mold member adheres to the display panel by an adhesion member so as to be fixed to each other.

SUMMARY

The present disclosure provides a display device including a heating wire for softening an adhesion member disposed between a display panel and a mold member, and a method for manufacturing the same.

An embodiment provides a display device including a display panel including a top surface and a bottom surface facing the top surface in a normal direction; a mold member including a seat surface on which the bottom surface is disposed and an outer surface, an adhesion member disposed between the bottom surface and the seat surface to fix the bottom surface to the seat surface; a heating wire contacting the adhesion member, and an accommodation member coupled to the mold member.

In an embodiment, a display area and a non-display area surrounding the display area may be defined on the bottom surface, and the heating wire may overlap the seat surface and be disposed on the non-display area of the bottom surface.

In an embodiment, the display device may further include: a flexible circuit board having one end connected to the heating wire, and a driving circuit board disposed in a lower portion of the accommodation member, connected to the other end of the flexible circuit board, and configured to supply current to the heating wire through the flexible circuit board.

In an embodiment, the heating wire may include a wire disposed on the bottom surface and a pad connected to one end of the wire, and the pad may be bonded to be electrically connected to the one end of the flexible circuit board.

In an embodiment, the non-display area may include a first non-display area and a second non-display area, which are spaced apart from each other in a first direction to face each other, and a third non-display area and a fourth non-display area, which are spaced apart from each other in a second direction crossing the first direction to face each other, and the heating wire is disposed on the first to third non-display areas of the bottom surface.

In an embodiment, the display may further include a cover member configured to cover an upper portion of the display panel corresponding to the fourth non-display area.

In an embodiment, the heating wire may be disposed on the seat surface.

In an embodiment, the heating wire may include a wire disposed on the seat surface and a pad that is connected to one end of the wire and disposed on the outer surface.

In an embodiment, the accommodation member may include a bottom part and a sidewall that is bent from the bottom part and combined with the mold member, and the outer surface and the seat surface may face each other with the sidewall therebetween.

In an embodiment, the heating wire may be disposed within the adhesion member.

In an embodiment, the adhesion member may include a hot melt adhesive.

In an embodiment, the display panel may be curved to surround a central axis of the display panel.

In an embodiment, a method for manufacturing a display device includes: attaching an adhesion member to a seat surface of a mold member, disposing a bottom surface of the display panel on the seat surface, supplying current to at least one heating wire contacting the adhesion member, and combining the mold member with an accommodation member.

In an embodiment, a display area and a non-display area surrounding the display area may be defined on the bottom surface, and the method may further include patterning the heating wire on the bottom surface corresponding to the non-display area.

In an embodiment, the supplying of the current to the heating wire may include: outputting the current from a driving circuit board, and supplying the current outputted from the driving circuit board to the heating wire through a flexible circuit board, wherein the flexible circuit board has one end connected to the driving circuit board and the other end connected to the heating wire.

In an embodiment, the heating wire may be injection-molded on the seat surface.

In an embodiment, the heating wire may include a wire disposed on the seat surface and a pad that is connected to one end of the wire and disposed on an outer surface of the mold member.

In an embodiment, the supplying of the current to the one heating wire may include supplying the current from the outside through one end of the heating wire disposed on the outer surface.

In an embodiment, the adhesion member may include a hot melt adhesive.

In an embodiment, the display panel may be curved to surround a central axis of the display panel.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms of first and second are used herein to describe various elements, these elements should not be limited by these terms. The terms are only used to distinguish one component from other components. For example, a first element can be referred to as a second element, and similarly a second element can be referred to as a first element without departing from the scope of the present disclosure. The terms of a singular form may include plural forms unless definitely referred to the contrary in terms of the context.

In the description, it will be understood that the meaning of 'include' or 'comprise' specifies a property, a fixed number, a step, a process, an element, a component, and/or a combination thereof but does not exclude one or more of properties, fixed numbers, steps, processes, elements, components, and/or combinations thereof in advance.

Figure 1:
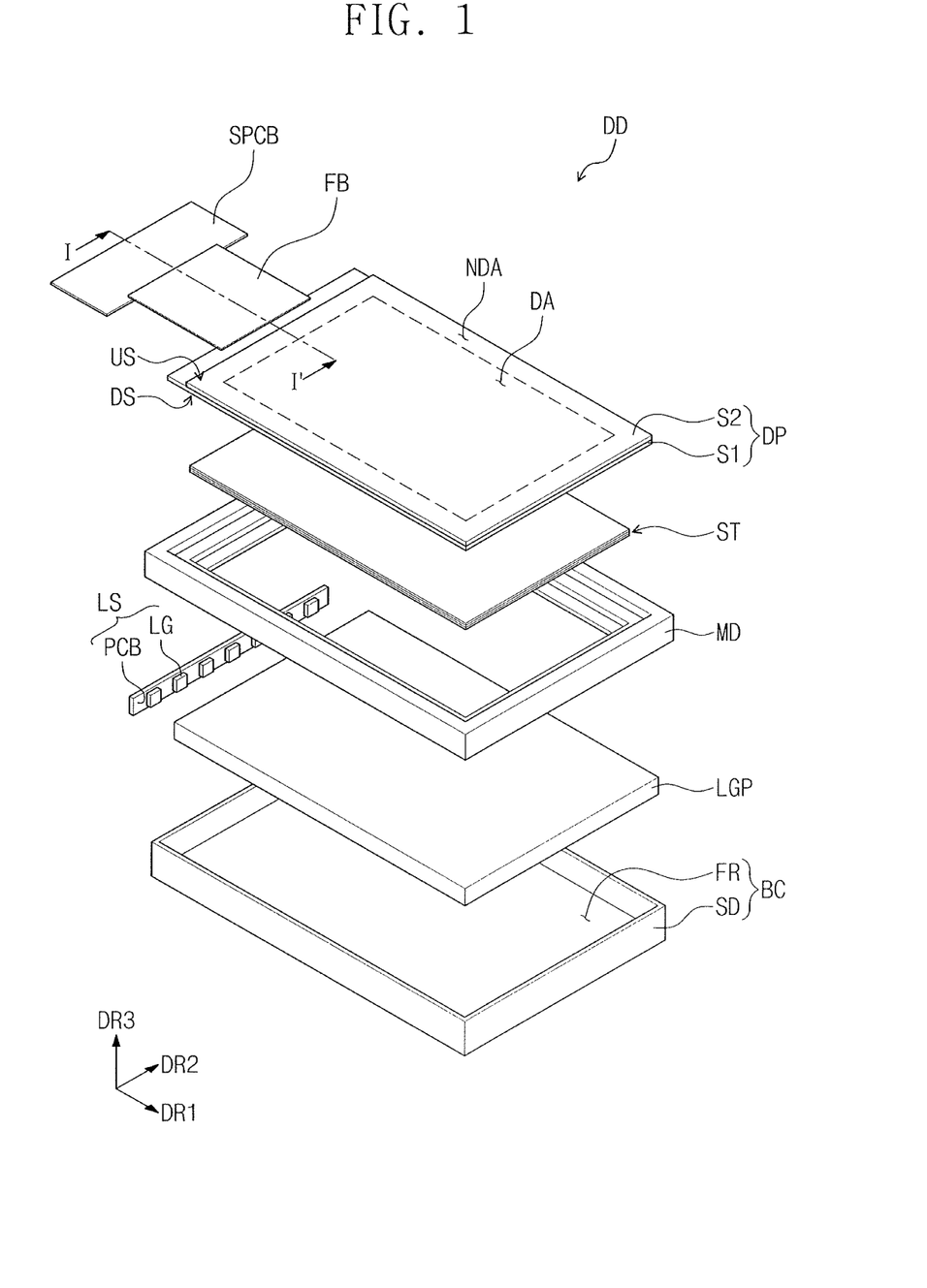
FIG. 1 illustrates an exploded perspective view of a display device according to an embodiment.
Figure 2:
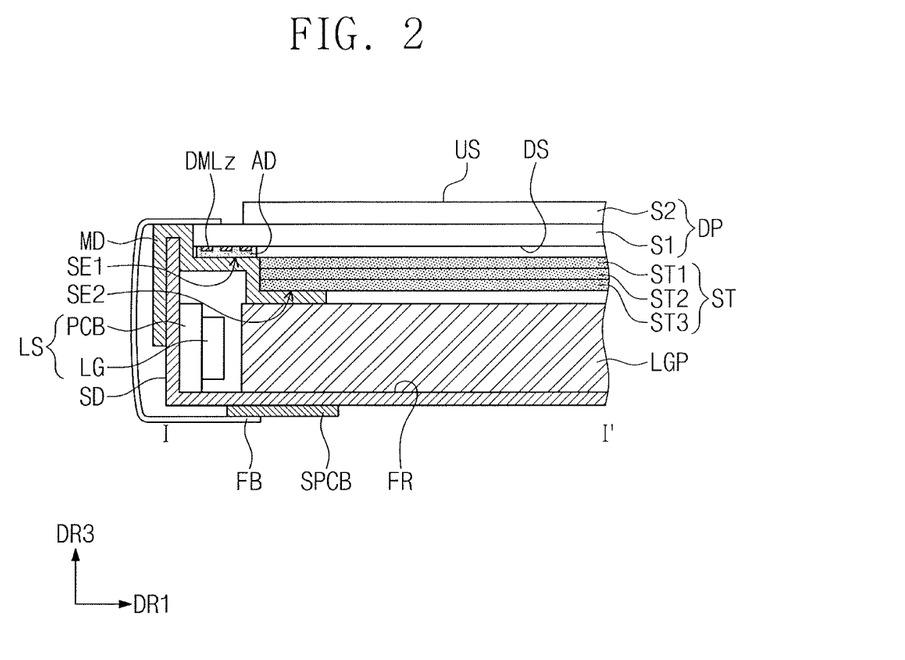
FIG. 2 illustrates a cross-sectional view taken along line I-I' of FIG. 1 according to an embodiment.

FIG. 1 is an exploded perspective view of a display device according to an embodiment. FIG. 2 is a cross-sectional view taken along line I-I' of FIG. 1 according to an embodiment. Also, the cross-sectional view of FIG. 2 is described as a cross-sectional view in a state in which a circuit board FB and a driving circuit board SPCB are accommodated in an accommodation member BC.

A display device DD according to embodiments may be applied to televisions or large electronic equipment, e.g., outdoor advertisement boards, and small-to-medium electronic equipment, e.g., personal computers, laptop computers, navigation units for vehicles and cameras. Also, the display device DD according to embodiments may be applied to electronic devices, e.g., tablet computers, smart phones, personal digital assistants (PDAs), portable multimedia players (PMPs), game consoles, and wrist watch type electronic devices. The devices are exemplified as merely an exemplary embodiment, and thus other electronic devices may be adopted unless departing from the spirit and scope of embodiments.

Referring to FIGS. 1 and 2, the display device DD may include the accommodation member BC, a display panel DP, a mold member MD, the circuit board FB, the driving circuit board SPCB, and a backlight unit.

The accommodation member BC may accommodate overall constituents of the display device DD in addition to the display panel DP, the mold member MD, and the backlight unit. The accommodation member BC may include a bottom part FR and a plurality of sidewalls SD bent from edges of the bottom part FR in a third direction DR3.

The display panel DP may be disposed in the uppermost portion. According to an embodiment, the display panel DP may be, e.g., a liquid crystal display panel, an organic light emitting display panel, an electrophoretic display panel, and electrowetting display panel. However, the embodiment is not limited thereto. Hereinafter, in the description, the liquid crystal display panel will be described as an example.

Also, the display panel DP for displaying an image is parallel to a surface defined by a first direction DR1 and a second direction DR2. A normal direction of the display panel DP is indicated as the third direction DR3. The third direction DR3 indicates a thickness direction of the display device DD. Each of the members has front and rear surfaces distinguished by the third direction DR3. However, directions that are indicated as the directions DR1, DR2, and DR3 may be a relative concept and thus be changed to other directions.

Also, the display panel DP has a top surface US and a bottom surface DS facing, e.g., opposite, the top surface US in the third direction DR3. Here, the bottom surface DS may be a surface, which faces optical sheets ST, of a first substrate S1, and the top surface US may be a surface, which displays an image to the outside, of a second substrate S2. A display area DA, on which an image is displayed, and a non-display area NDA, on which an image is not displayed, may be defined on the top surface US and the bottom surface DS. The non-display area NDA may be an area surrounding the display area DA. Although not shown, the display device DD may further include a window member that covers the display panel DP and transmits an image to the outside.

In detail, the display panel DP includes the first substrate S1, the second substrate S2, and a liquid crystal layer disposed between the first substrate S1 and the second substrate S2. A plurality of gate lines, a plurality of data lines, and a plurality of pixels may be disposed on the first substrate S1. The pixels may be arranged in a matrix form.

These pixels are connected to corresponding gate lines of the plurality of gate lines and to corresponding data lines of the plurality of data lines, respectively. A common electrode and a color filter may be disposed on the second substrate S2.

The circuit board FB may electrically connect the driving circuit board SPCB to the first substrate S1. The circuit board FB may have a first end bonded to the driving circuit board SPCB and a second end bonded to the first substrate S1. For example, the circuit board FB may be provided as a flexible printed circuit board.

The driving circuit board SPCB may be disposed in a lower portion of the accommodation member BC. The driving circuit board SPCB may be connected to one end of the circuit board FB to supply a plurality of signals to the display panel DP. For example, the driving circuit board SPCB may supply a plurality of image signals and a plurality of driving signals, which are needed to display an image, to the display panel DP through the circuit board FB.

The mold member MD is disposed between the display panel DP and the accommodation member BC. The mold member MD may be coupled to the accommodation member BC to support the display panel DP and a plurality of optical sheets ST.

In detail, as illustrated in FIG. 2, a first seat surface SE1 and a second seat surface SE2 having a stepped shape with respect to the first seat surface SE1 may be defined inside the mold member MD. The display panel DP is disposed on the first seat surface SE1, and the optical sheets ST are disposed on the second seat surface SE2. Also, since the first seat surface SE1 and the second seat surface SE2 may have heights different from each other, a predetermined distance may occur between the optical sheets ST and the display panel DP.

Although the structure in which the mold member MD according to embodiments includes the first seat surface SE1 and the second seat surface SE2 is described, the second seat surface SE2 may be omitted. The mold member MD according to embodiments may have various shapes.

The backlight unit may be disposed between the display panel DP and the accommodation member BC. In detail, the backlight unit includes a light source LS, a light guide plate LGP, and the optical sheets ST.

The light guide plate LGP may be disposed under the optical sheet ST and be accommodated in the accommodation member BC. For example, as illustrated in FIG. 1, the light guide plate LGP may have a first surface that extends in the second direction DR2 and faces the light source LS. That is, the light guide plate LGP receives light emitted from a plurality of light emitting elements LG of the light source LS through the first surface, and the light guide plate LGP may guide the received light to the display panel DP.

In another example, two side surfaces of the light guide plate LGP that face each other and extend in the second direction DR2, i.e., the two side surfaces may be spaced apart from each other along the first direction DR1, may face two separate light sources LS. That is, the two separate light sources LS may be spaced apart from each other in the first direction DR1 with the light guide plate LGP therebetween, so the two side surfaces of the light guide plate LGP may receive light from the two separate light sources LS.

The optical sheets ST may be disposed between the display panel DP and the light guide plate LGP on the second seat surface SE2. The optical sheets ST may control a path of light that is emitted from the light guide plate LGP and then is received into the display panel DP. As illustrated in FIG. 2, the optical sheets ST may include an upper diffusion sheet ST1 and a lower diffusion sheet ST3, which diffuse the light emitted from the light guide plate LGP, and a prism sheet ST2 for collecting the light emitted from the light guide plate LGP. The upper diffusion sheet ST1 is disposed on a top surface of the prism sheet ST2, and the lower diffusion sheet ST2 is disposed on a bottom surface of the prism sheet ST2. However, the embodiment is not limited thereto. For example, the optical sheets ST may be variously deformed.

The light source LS includes the plurality of light emitting elements LG and a printed circuit board PCB on which the plurality of light emitting elements LG are disposed. The light source LS may be accommodated in the accommodation member BC to face the first surface of the light guide plate LGP.

The printed circuit board PCB has a shape extending in the second direction DR2, i.e., along the first surface of the light guide plate LGP, and the light emitting elements LG are arranged on the printed circuit board PCB to be spaced apart from each other along the second direction DR2. The light emitting elements LG generate light required for displaying an image and emit the generated light in the first direction DR1 toward the first surface of the light guide plate LGP.

As illustrated in FIG. 2, an adhesion member AD may be disposed between the bottom surface DS of the display panel DP and the first seat surface SE1 of the mold member MD to fix the display panel DP to the mold member MD. According to an embodiment, the adhesion member AD may be provided as a hot melt adhesive. The hot melt adhesive may be formed of a thermoplastic resin. For example, the hot melt adhesive may be softened at a high temperature state due to external heat and be hardened at a low temperature state. That is, the hot melt adhesive may have weak adhesion strength when softened, i.e., at the high temperature state, and strong adhesion strength when hardened, i.e., at the low temperature state.

As further illustrated in FIG. 2, the display device DD according to an embodiment may include a heating wire DMLz, e.g., directly, contacting the adhesion member AD disposed between the display panel DP and the mold member MD. The heating wire DMLz may increase its temperature in response to current applied from the outside. As a result, the adhesion member AD disposed between the display panel DP and the mold member MD may be softened by the heating wire DMLz. In other words, application of current to the heating wire DMLz increases the temperature of the heating wire DMLz, thereby heating and softening the adhesion member AD. As the adhesion member AD is softened, the display panel DP and the mold member MD, which are fixed to each other by the adhesion member AD, may be easily separated from each other due to the reduced adhesion of the adhesion member AD at a softened state.

According to an embodiment, the heating wire DMLz may be disposed on, e.g., directly on, the bottom surface DS of the display panel DP, as illustrated in FIG. 2. For example, the heating wire DMLz may be patterned on the bottom surface DS of the display panel DP, e.g., the heating wire DMLz may be patterned into multiple sections on the bottom surface DS to be spaced apart from each other along the entire adhesion member AD. That is, the heating wire DMLz may overlap the, e.g., entire, first seat surface SE1 and, e.g., directly, contact the bottom surface DS corresponding to the non-display area NDA.

Figure 3A:
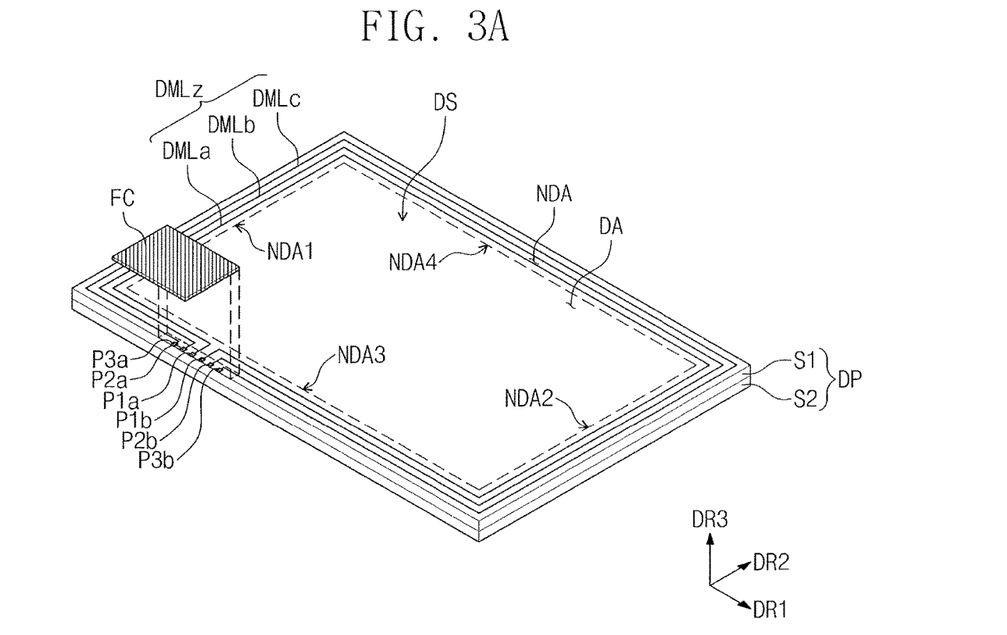
FIG. 3A illustrates a perspective view of a display panel according to an embodiment.
Figure 3B:
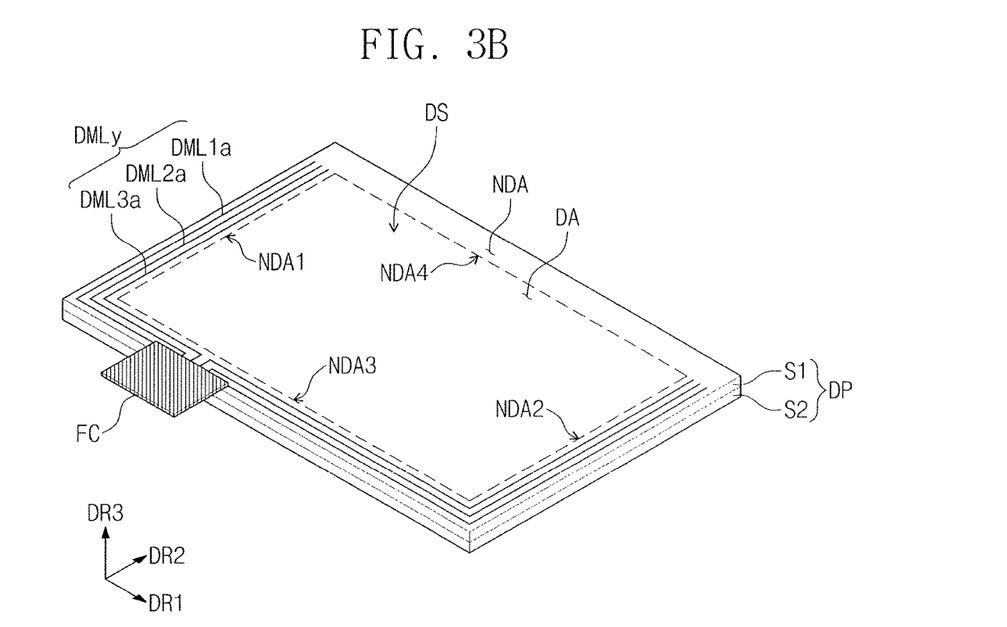
FIG. 3B illustrates a perspective view of a display panel according to another embodiment.

FIG. 3A is a perspective view of the display panel DP according to an embodiment. FIG. 3B is a perspective view of the display panel DP according to another embodiment. The display panels DP in FIGS. 3A-3B are illustrated as viewed from the bottom surface DS.

The display panel DP of FIG. 3A may have a structure in which a cover member is removed from the upper portion thereof. The display panel DP of FIG. 3B may have a structure in which the cover member is disposed on the display panel DP on at least an area of the non-display area NDA. Here, the cover member may be disposed above the display panel and be coupled to the accommodation member BC.

The non-display area NDA surrounding the display area DA includes a first non-display area NDA1 and a second non-display area NDA2, which are spaced apart from each other in the first direction DR1 to face each other. Also, the non-display area NDA includes a third non-display area NDA3 and a fourth non-display area NDA4, which are spaced apart from each other in the second direction DR2 crossing the first direction DR1 to face each other.

Referring to FIG. 3A, the heating wire DMLz may be disposed on the bottom surface DS corresponding to the non-display area NDA to surround the display area DA. Hereinafter, according to the description, a structure in which the heating wire DMLz includes a plurality of first to third wires DMLa, DMLb, and DMLc and a plurality of first to sixth pads P1a to P3b connected to the plurality of first to third wires DMLa to DMLc will be described as an example. However, the technical idea is not limited thereto, and the number of the wires and pads provided in the heating wire DMLz may be variously changed.

The first to third wires DMLa to DMLc may be disposed on the bottom surface DS to, e.g., entirely, surround the display area DA. The first wire DMLa may be disposed closest to the display area DA, and the third wire DMLc may be disposed farthest from the display area DA. The second wire DMLb may be disposed between the first wire DMLa and the third wire DMLc. For example, as illustrated in FIG. 3A, the first to third wires DMLa to DMLc may be shaped as concentric frames radially spaced apart from each other equidistantly to facilitate uniform heating of the adhesion member AD.

Also, the first wire DMLa has a first end connected to the first pad P1a and a second end connected to the second pad P1b. The second wire DMLb has a first end connected to the third pad P2a and a second end connected to the fourth pad P2b. The third wire DMLc has a first end connected to the fifth pad P3a and a second end connected to the sixth pad P3b. For example, the first to six pads P1a to P3b may be disposed on an edge of the bottom surface DS corresponding to the third non-display area NDA3.

According to an embodiment, a connection circuit board FC may be disposed on the first to sixth pads P1a to P3b. In this case, a plurality of pads disposed on a first end of the connection circuit board FC and the first to six pads P1a to P3b disposed on the bottom surface DS may be bonded to be electrically connected to each other. Here, the connection circuit board FC may be provided as a flexible printed circuit board.

That is, in the second direction DR2, the connection circuit board FC may have a first end connected to the bottom surface DS, i.e., to the first to six pads P1a to P3b on the bottom surface DS, and a second end connected to the driving circuit board SPCB. For example, the connection circuit board FC may bend around an edge of the display panel DP toward the driving circuit board SPCB on the bottom of the accommodation member BC (refer to FIG. 2). Thus, the driving circuit board SPCB may supply an electrical signal to the first to sixth pads P1a to P3b through the connection circuit board FC. The electrical signal supplied to the first to sixth pads P1a to P3b is supplied to the first to third wires DMLa to DMLc. Here, the electrical signal may be current.

Thus, heat may be generated in the first to third wires DMLa to DMLc in response to the electrical signal supplied from the driving circuit board SPCB. As a result, the adhesion member (see reference symbol AD of FIG. 2) adhering to the first to third wires DMLa to DMLc may be softened. As the adhesion member AD is softened, the display panel DP and the mold member MD may be easily separated from each other.

Although the connection circuit board FC has the second end connected to the driving circuit board SPCB to receive the electrical signal from the driving circuit board SPCB, the embodiment is not limited thereto. For example, the connection circuit board FC may have the second end connected to a separate external circuit board to receive the electrical signal in addition to the driving circuit board SPCB connected to the first substrate S1.

Referring to FIG. 3B, a heating wire DMLy may be disposed on the bottom surface DS corresponding to the first to third non-display areas NDA1 to NDA3. As the cover member is disposed on the display panel DP overlapping the fourth non-display area NDA4, the separate heating wire DMLy is not disposed on the bottom surface DS corresponding to the fourth non-display area NDA4.

That is, the cover member covers an upper portion of the display panel DP corresponding to the fourth non-display area NDA4 and is coupled to the accommodation member (see reference symbol BC of FIG. 2). As the cover member and the accommodation member BC are coupled to each other, the display panel DP and the mold member MD may be fixed to each other. As a result, the adhesion member AD may not also be disposed on the first seat surface (see reference symbol SE1 of FIG. 2) overlapping the fourth non-display area NDA4.

The connection circuit board FC illustrated in FIG. 3B may have substantially the same structure as the connection circuit board FC illustrated in FIG. 3A. Thus, descriptions thereof will be omitted.

Figure 4:
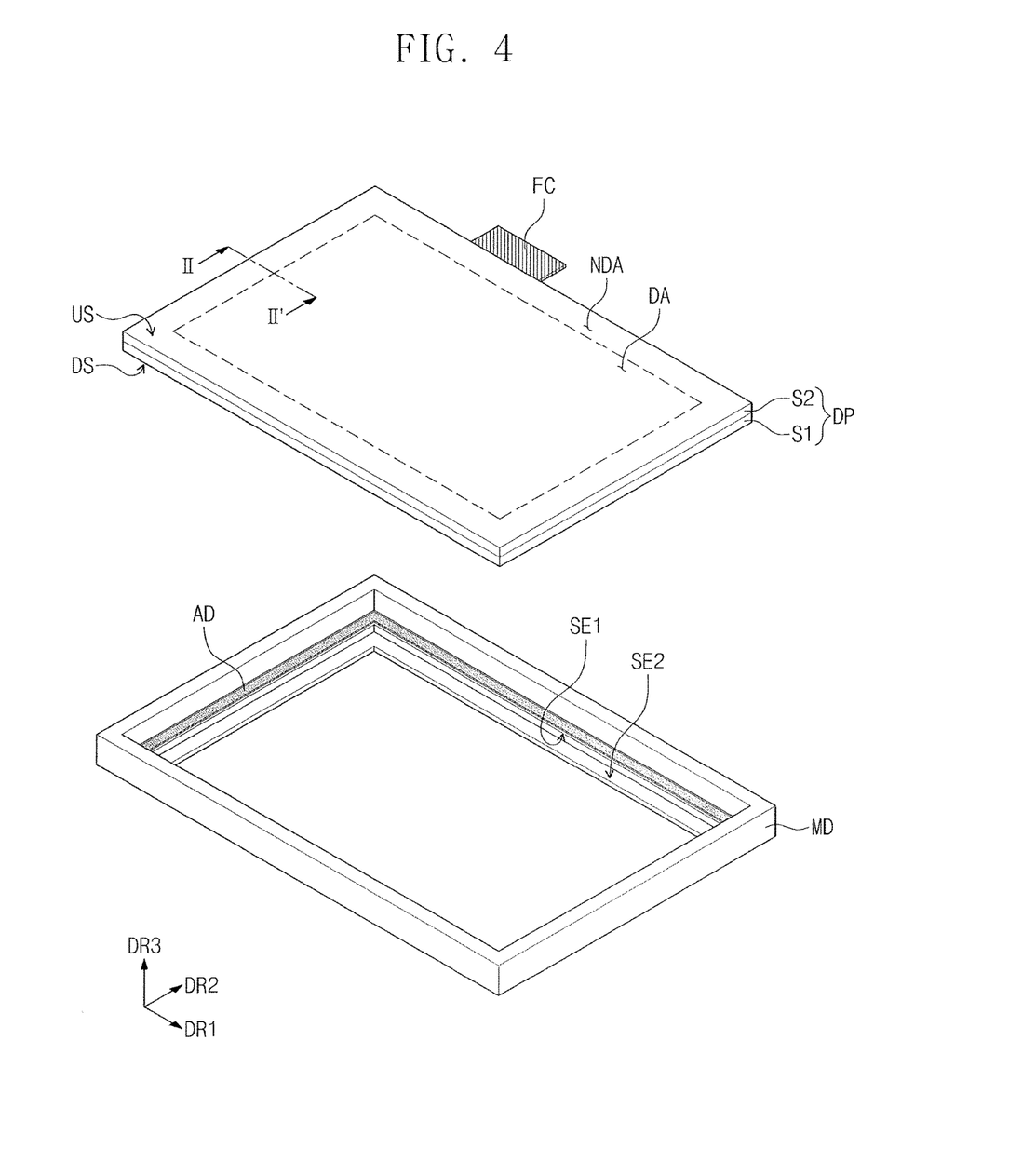
FIG. 4 illustrates an exploded perspective view of a display panel and a mold member according to an embodiment.
Figure 5:
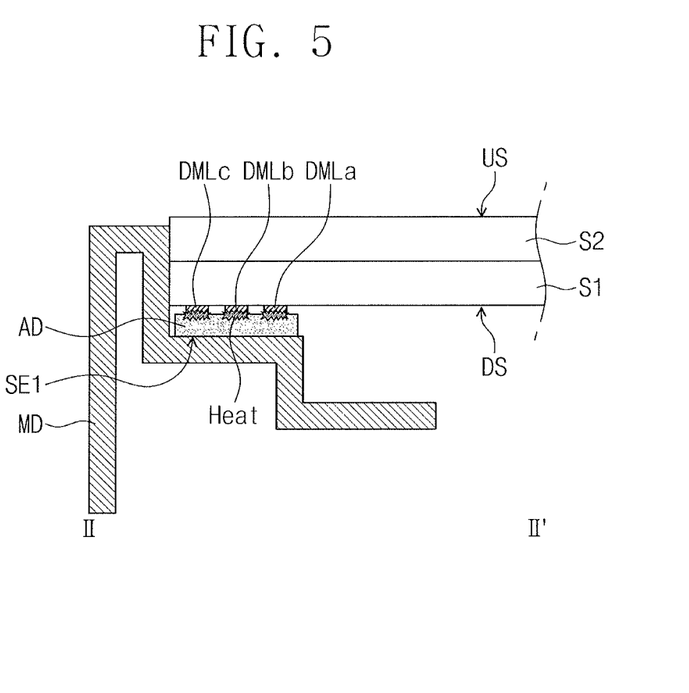
FIGS. 5 and 6 illustrate cross-sectional views taken along line II-II' of FIG. 4.
Figure 6:
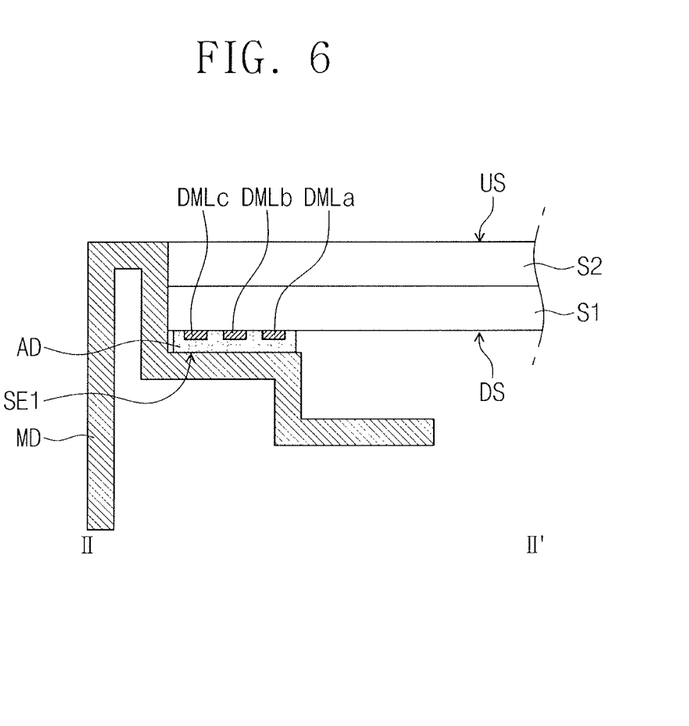

FIG. 4 is an exploded perspective view of the display panel DP and the mold member MD. FIGS. 5 and 6 are cross-sectional views taken along line II-II' of FIG. 4.

Referring to FIGS. 4 to 6, a method in which the display panel DP and the mold member MD are fixed to each other by the adhesion member AD is described.

According to an embodiment, the adhesion member AD may be disposed on the first seat surface SE1. Then, the display panel DP may be disposed on the first seat surface SE1. That is, the bottom surface DS corresponding to the non-display area NDA may be disposed on the first seat surface SE1. In this case, the heating wire DMLz disposed on the bottom surface DS may contact the adhesion member AD disposed on the first seat surface SE1.

Hereinafter, referring to FIG. 5, the driving circuit board SPCB illustrated in FIG. 2 may supply an electrical signal to the first to third wires DMLa to DMLc through the connection circuit board FC. Heat may be generated from the first to third wires DMLa to DMLc as the electrical signal is supplied to the first to third wires DMLa to DMLc. The adhesion member AD is softened by the heat generated from the first to third wires DMLa to DMLc.

Referring to FIG. 6, as the adhesion member AD is softened, the adhesion member AD overlapping the first seat surface SE1 may contact the bottom surface DS. Thereafter, as the electrical signal is not supplied from the driving circuit board SPCB, the adhesion member AD may be cooled down, thereby hardening. As a result, the bottom surface DS of the display panel DP and the mold member MD may be fixed to each other by the hardened adhesion member AD.

Similarly, as a method of separating the display panel DP and the mold member MD, the electrical signal may be applied to the heating wire DMLz to heat and soften the adhesion member AD. As the adhesion member AD is softened by the heating wire DMLz, the display panel DP and the mold member MD may be easily separated without applying separate physical force.

Figure 7:
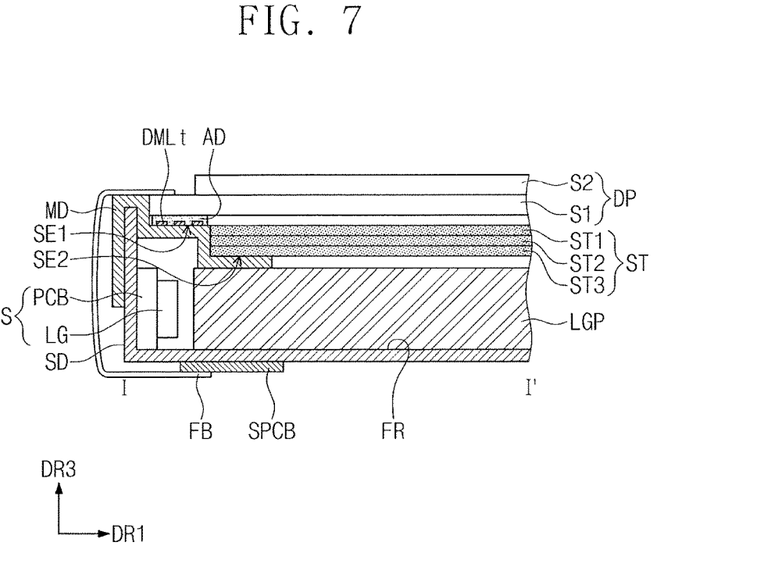
FIG. 7 illustrates a cross-sectional view taken along line I-I' of FIG. 1 according to another embodiment.

FIG. 7 is a cross-sectional view taken along line I-I' of FIG. 1 according to another embodiment. When a display device illustrated in FIG. 7 is compared to the display device illustrated in FIG. 2, the display device of FIG. 7 may be substantially the same as that of FIG. 2 except for structures of an adhesion member AD and a heating wire DMLt. Thus, the adhesion member AD and the heating wire DMLt will be described with reference to FIG. 7, and descriptions with respect to other constituents will be omitted.

Referring to FIG. 7, the heating wire DMLt may be disposed on the first seat surface SE1. According to an embodiment, the heating wire DMLt may be disposed on the mold member MD through injection molding. That is, the mold member MD is injection-molded through the injection molding process. Thereafter, the heating wire DMLt may be disposed on the first seat surface SE1 and injection-molded together with the mold member MD. However, a method of disposing the heating wire DMLt on the first seat surface SE1 may be variously changed. For example, the heating wire DMLt may be disposed on the first seat surface SE1 through a deposition process.

That is, the heating wire DMLt of FIG. 7 may be disposed on the first seat surface SE1 of the mold member MD, unlike the heating wire DMLz of FIG. 2 disposed on the bottom surface DS of the display panel DP. In this case, the separate connection circuit board (see reference symbol FC FIG. 3A) for supplying the electrical signal to the heating wire DMLt may be unnecessary in the display device illustrated in FIG. 7.

Also, the adhesion member AD illustrated in FIG. 7 may not be disposed on the first seat surface SE1, but be disposed on the bottom surface DS of the display panel DP. Similarly, the adhesion member AD disposed on the bottom surface DS of the display panel DP may be provided as a hot melt adhesive. This hot melt adhesive may include a thermoplastic resin.

Figure 8:
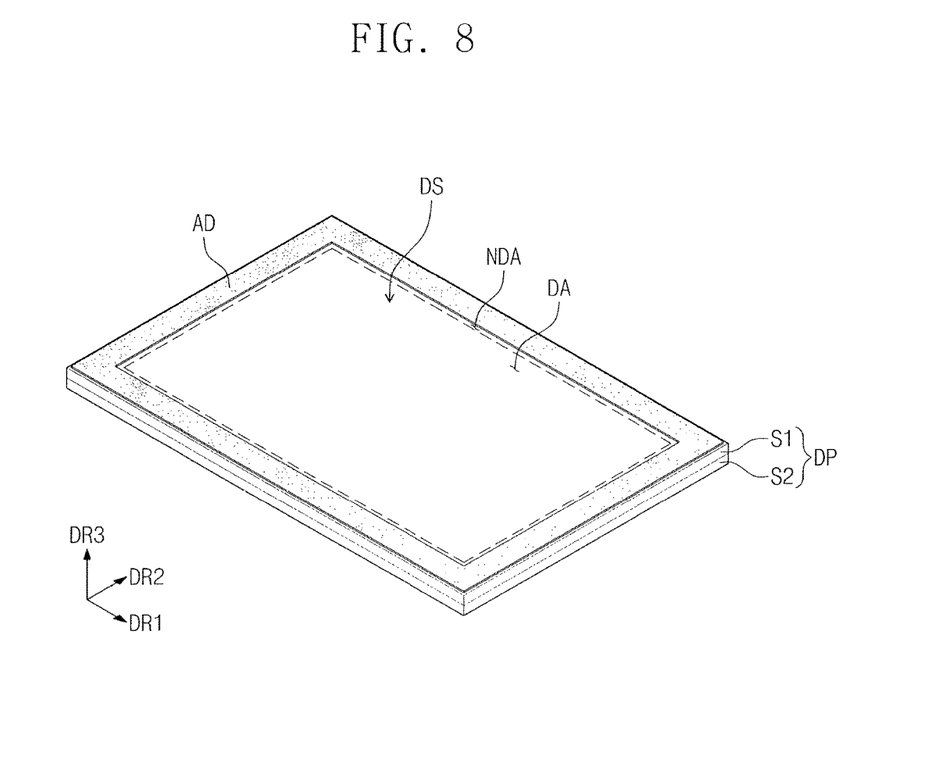
FIG. 8 illustrates a perspective view of a display panel according to another embodiment.
Figure 9:
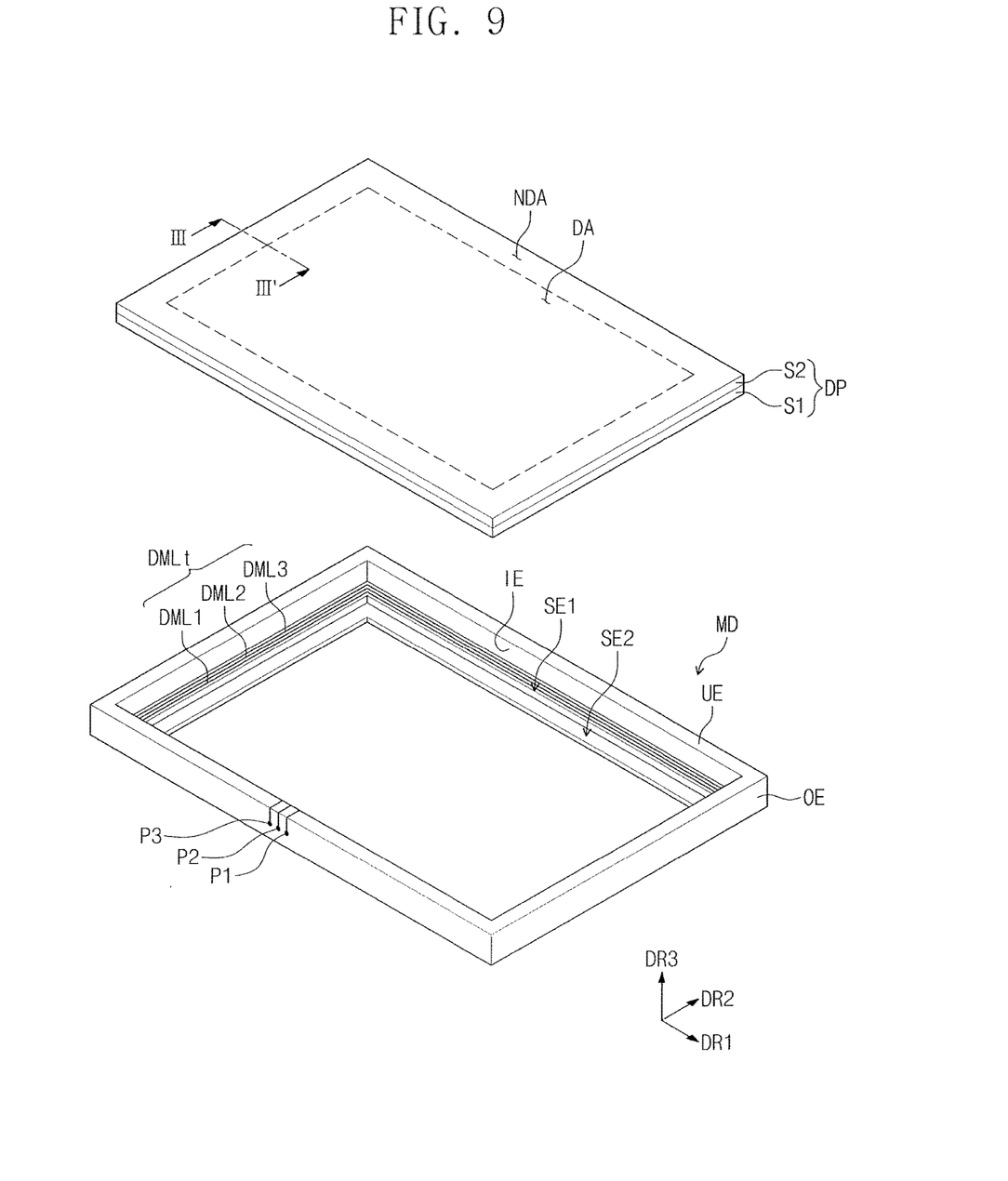
FIG. 9 illustrates an exploded perspective view of a display panel and a mold member according to another embodiment.
Figure 10:
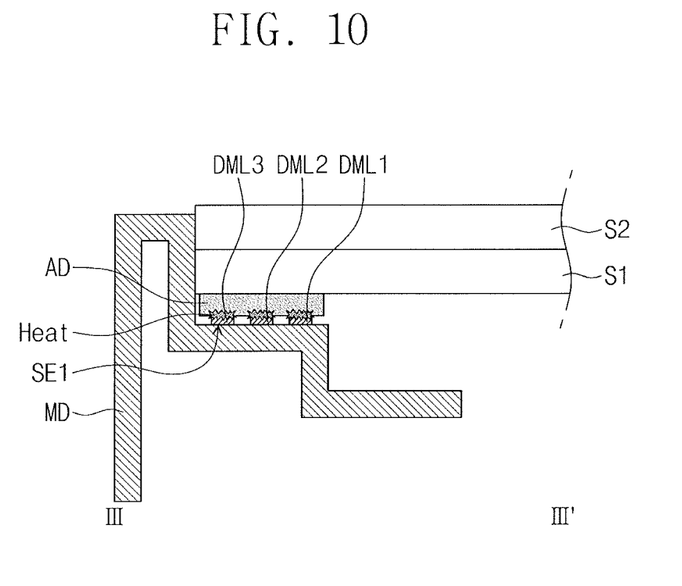
FIGS. 10 and 11 illustrate cross-sectional views taken along line III-III' of FIG. 9.
Figure 11:
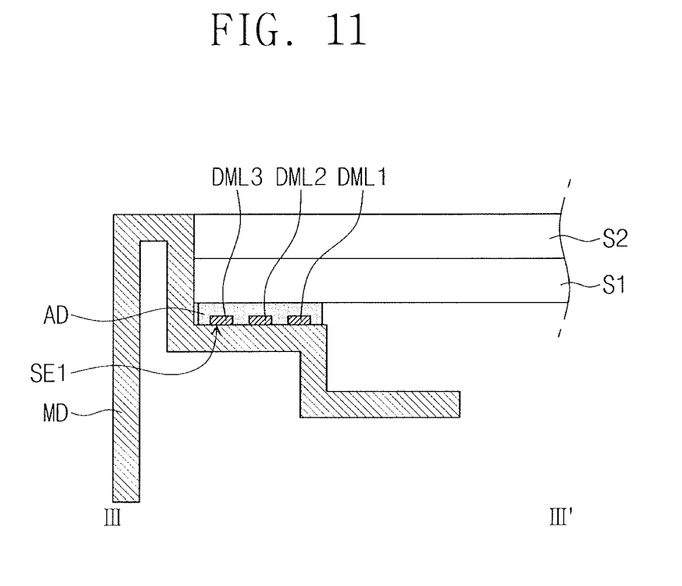

FIG. 8 is a perspective view of a display panel according to another embodiment. FIG. 9 is an exploded perspective view of a display panel and a mold member according to another embodiment. FIGS. 10 and 11 are cross-sectional views taken along line III-III' of FIG. 9.

Referring to FIGS. 8 and 9, the mold member MD includes the first seat surface SE1 and the second seat surface SE2 therein. Also, the mold member MD includes an inner surface IE extending from the first seat surface SE1 in the third direction DR3. The mold member MD includes an outer surface OE facing the inner surface IE. The inner surface IE and the outer surface OE may be connected to each other by an upper surface UE of the mold member MD.

According to an embodiment, the adhesion member AD may be disposed on the bottom surface DS of the display panel DP. Particularly, the adhesion member AD may be disposed on the bottom surface DS corresponding to the non-display area NDA.

According to an embodiment, the heating wire DMLt may be disposed on the first seat surface SE1 of the mold member MD. Hereinafter, according to embodiments, a structure in which the heating wire DMLt includes a plurality of first to third wires DML1, DML2, and DML3 and a plurality of first to third pads P1 to P3 connected to the plurality of first to third wires DML1 to DML3 will be described as an example. However, the technical idea is not limited thereto, and the number of the wires and pads provided in the heating wire DMLt may be variously changed.

The first wire DML1 may be disposed closest to the display area DA, and the third wire DML3 may be disposed farthest from the display area DA. The second wire DML2 may be disposed between the first wire DML1 and the third wire DML3. Also, the first to third wires DML1 to DML3 include a first wire area overlapping the first seat surface SE1 in the third direction DR3 and a second wire area overlapping the inner surface IE in the second direction DR2. Also, the first to third wires DML1 to DML3 may include a third wire area overlapping the upper surface UE in the third direction DR3 and a fourth wire area overlapping the outer surface OE in the second direction DR2.

The first to third pads P1 to P3 may be respectively connected to ends of the first to third wires DML1 to DML3 and be disposed on the outer surface OE. The first wire DML1 has one end connected to the first pad P1, the second wire DML2 has one end connected to the second pad P2, and the third wire DML3 has one end connected to the third pad P3.

As illustrated in FIG. 9, although the first to third wires DML1 to DML3 have ends respectively connected to the first to third pads P1 to P3, the embodiment is not limited thereto. As the wires illustrated in FIG. 3A or 3B, each of the first to third wires DML1 to DML3 may have a second end respectively connected to the pads disposed on the outer surface OE. That is, one wire may have the first and second ends, which are respectively connected to the pads.

Hereinafter, a method in which the display panel DP and the mold member MD are fixed to each other by the adhesion member AD will be described.

According to an embodiment, the adhesion member AD may be disposed on the bottom surface DS of the display panel DP. Then, the bottom surface DS corresponding to the non-display area NDA may be disposed above the first seat surface SE1. In this case, the adhesion member AD disposed on the bottom surface DS may contact the heating wire DMLt disposed on the first seat surface SE1.

The external electrical signal may be supplied through the first to third pads P1 to P3 disposed on the outer surface OE. Here, the external electrical signal may be supplied by an external device connected to the first to third pads P1 to P3. The external device may be a separate device different from the constituents of the display device.

Referring to FIG. 10, as the electrical signal is supplied through the first to third pads P1 to P3 from the outside to the first to third wires DML1 to DML3, heat may be generated from the first to third wires DML1 to DML3. The adhesion member AD is softened by the heat generated from the first to third wires DML1 to DML3.

Referring to FIG. 11, as the adhesion member AD is softened, the adhesion member AD disposed on the bottom surface DS may contact the first seat surface SE1. Then, as the external electrical signal is not supplied to the first to third pads P1 to P3, the heat is not generated from the heating wire DMLt. As a result, the adhesion member AD begins to harden. As the adhesion member AD is hardened, the bottom surface DS and the mold member MD may be fixed to each other.

Similarly, as a method of separating the display panel DP and the mold member MD, the external electrical signal may be applied to the heating wire DMLt to soften the adhesion member AD. As the adhesion member AD is softened by the heating wire DMLt, the display panel DP and the mold member MD may be easily separated from each other without applying separate physical force.

However, although the heating wire DMLt is disposed on the entire first seat surface SE1, the embodiment is not limited thereto. That is, the cover member may be disposed on the display panel DP to correspond to one area of the non-display area NDA. In this case, the heating wire DMLt may not be disposed on the first seat surface SE1 overlapping the one area. Also, the adhesion member AD may not be disposed on the bottom surface DS overlapping the one area. This is done because the display panel DP and the mold member MA according to the one area may be fixed to each other by the cover member.

Figure 12:
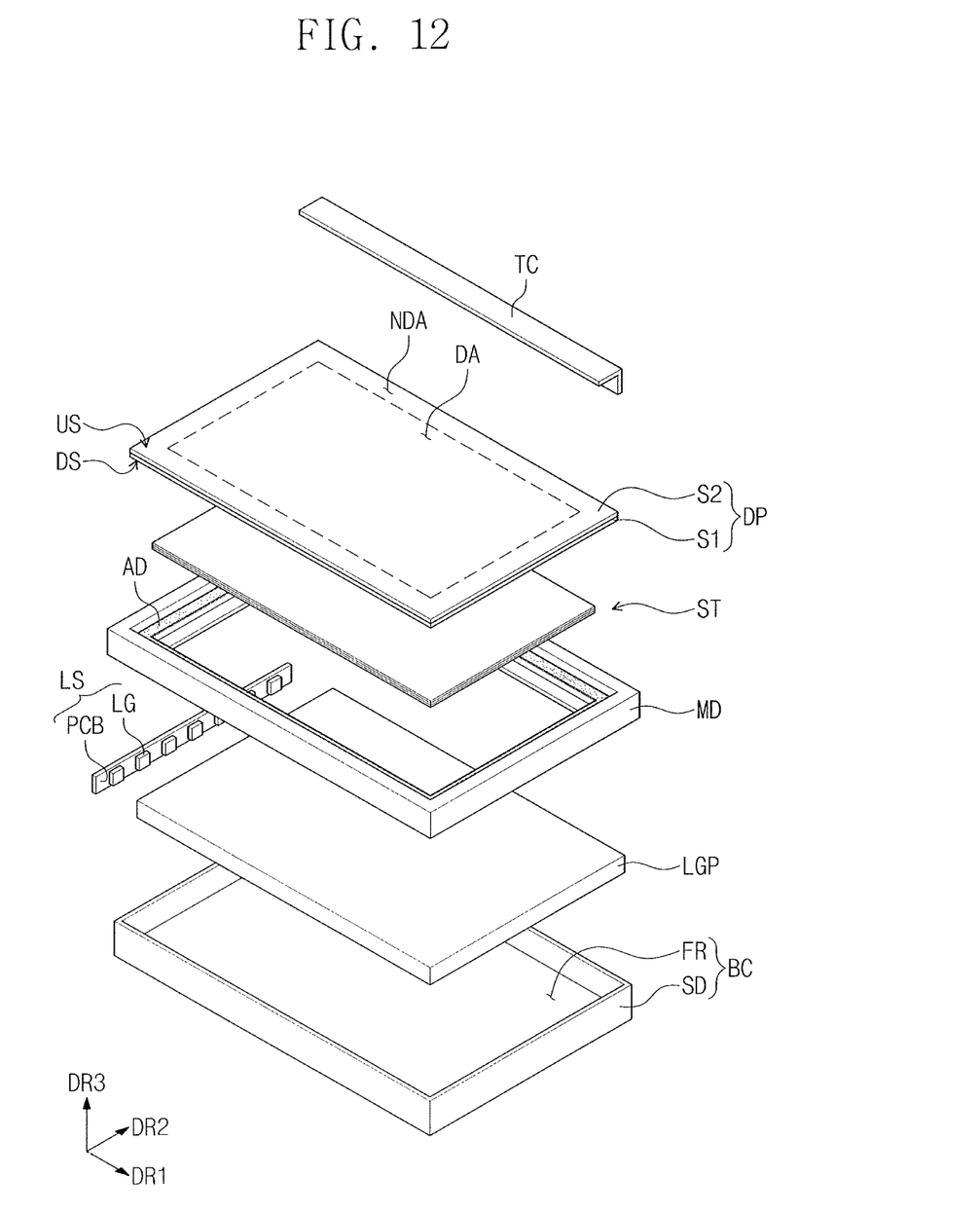
FIG. 12 illustrates an exploded perspective view of a display device according to another embodiment.

FIG. 12 is an exploded perspective view of a display device according to another embodiment. When compared to the display device DD of FIG. 1, the display device of FIG. 12 is substantially the same as that of FIG. 1 except that a cover member TC is added. Thus, the cover member TC will be described, but descriptions of other constituents will be omitted.

Referring FIGS. 3B to 12, the cover member TC may have a shape extending in the first direction DR1, and may be coupled to one side surface of the accommodation member BC.

As described above with reference to FIG. 3B, the cover member TC may be disposed on the display panel DP overlapping the fourth non-display area NDA4. As a result, the separate wire DMLy is not disposed on the bottom surface DS corresponding to the fourth non-display area NDA4. Also, the adhesion member AD is not disposed on the first seat surface SE1 overlapping the fourth non-display area NDA4. This is done because the display panel DP and the mold member MD corresponding to the fourth non-display area NDA4 are fixed to each other by the cover member TC.

Although the structure in which the cover member TC overlaps only the fourth non-display area NDA4 is illustrated in FIG. 12, the cover member TC may have various shapes. For example, the cover member TC may be omitted or disposed on the display panel to overlap at least one non-display area of the first to fourth non-display areas NDA1 to NDA4. The heating wire and the adhesion member may not be disposed on the bottom surface DS and the first seat surface SE1, which overlap the cover member TC.

Figure 13:
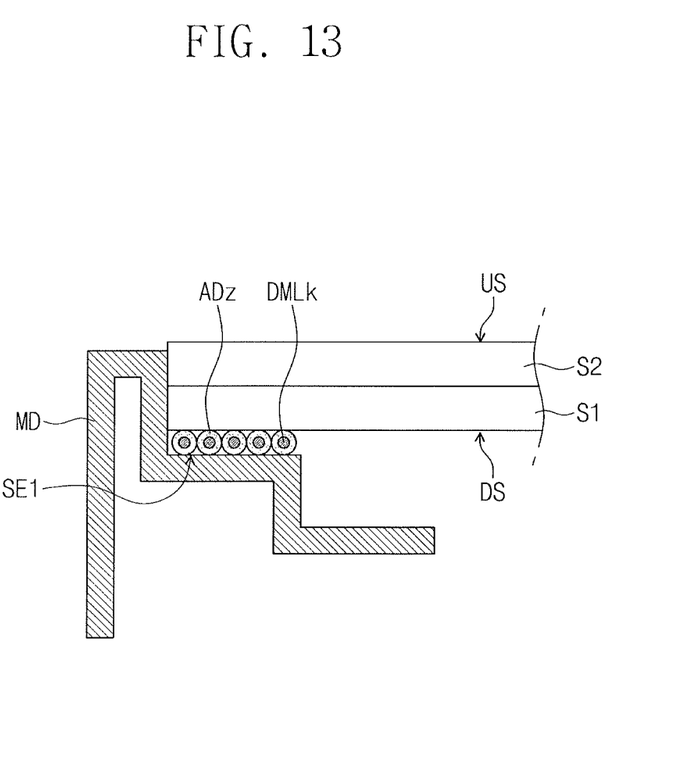
FIG. 13 illustrates a perspective view of an adhesion member and a heating wire to bond the display panel and the mold member according to another embodiment.

FIG. 13 is a perspective view of an adhesion member and a heating wire to bond a display panel and a mold member according to another embodiment.

When a display device of FIG. 13 is compared to the display device of FIG. 2, the display device of FIG. 13 is substantially the same as that of FIG. 2 except for the structures of an adhesion member ADz and a heating wire DMLk, but other constituents may be substantially the same as each other. Thus, the adhesion member ADz and the heating wire DMLk will be described with reference to FIG. 13, and descriptions with respect to other constituents will be omitted.

According to an embodiment, the heating wire DMLk may be disposed in, e.g., within, the adhesion member ADz. That is, the heating wire DMLk may be surrounded by the adhesion member ADz. Also, although a structure in which the heating wire DMLk is disposed in the adhesion member ADz having a circular shape as illustrated in FIG. 13 is described, the adhesion member ADz surrounding the heating wire DMLk may have various shapes.

Figure 14:
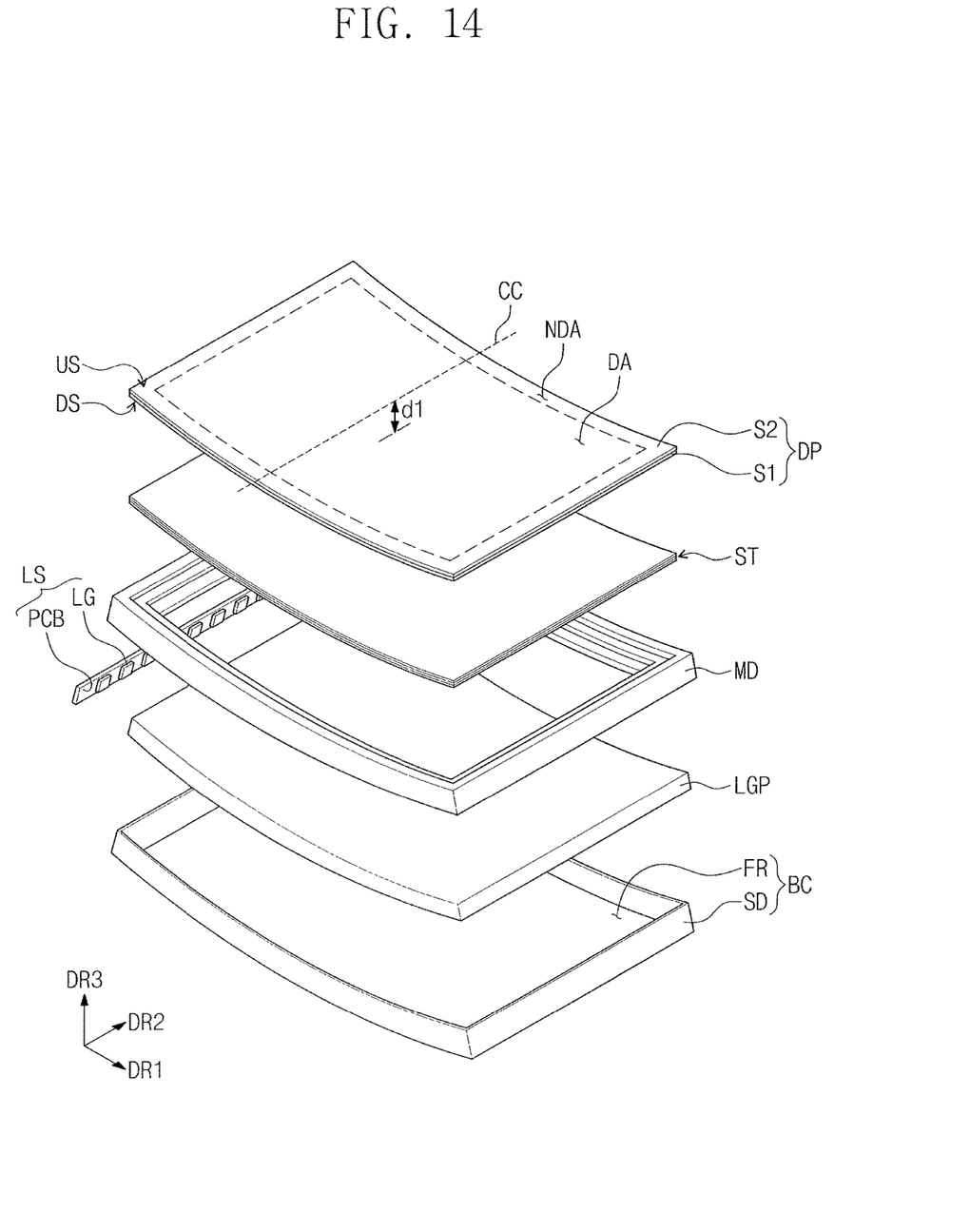
FIG. 14 illustrates an exploded perspective view of a display device according to another embodiment.

FIG. 14 is an exploded perspective view of a display device according to another embodiment. A display device of FIG. 14 may have substantially the same configuration as that of the display device DD of FIG. 1 except that that display device of FIG. 14 is curved.

According to an embodiment, the display device of FIG. 14 may have a curved shape. As the display device have the curved shape, the display device may have a curved surface. An image having three-dimensional effect, immersion, and presence may be displayed through the curved shape of the display device.

Referring to FIG. 14, the display device may be curved to surround a central axis CC. According to an embodiment, the central axis CC may be a line parallel with the second direction DR2 and be defined to be spaced a predetermined distance d1 from a top surface US of the display panel DP. Here, the top surface US may be a surface on which a user sees an image. Thus, the display panel DP may have a curved shape which is curved in the first direction DR1 crossing the second direction DR2.

According to an embodiment, a heating wire may be disposed on the bottom surface of the display panel or the seat surface of the mold member to soften the adhesion member disposed between the display panel and the mold member. As a result, the adhesion member for fixing the display panel and the mold member may be softened by the heating wire. Therefore, the display panel and the mold member, which are fixed to each other by the adhesion member, may be easily separated from each other.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display panel including a top surface and a bottom surface facing the top surface in a normal direction;
   a mold member including a seat surface and an outer surface, the bottom surface of the display panel being positioned on the seat surface of the mold member;
   an adhesion member between the bottom surface and the seat surface to fix the bottom surface to the seat surface;
   a heating wire contacting the adhesion member, the heating wire including a wire on the bottom surface of the display panel and a pad connected to a first end of the wire;
   a flexible circuit board, the pad being bonded to be electrically connected to a first end of the flexible circuit board; and
   an accommodation member coupled to the mold member.

2. The display device as claimed in claim 1, wherein the bottom surface includes a display area and a non-display area surrounding the display area, the heating wire overlapping the seat surface on the non-display area of the bottom surface.

3. The display device as claimed in claim 2, further comprising:
a driving circuit board in a lower portion of the accommodation member, the driving circuit board being connected to a second end of the flexible circuit board to supply current to the heating wire through the flexible circuit board.

4. The display device as claimed in claim 2, wherein the non-display area includes:
a first non-display area and a second non-display area, which are spaced apart from each other in a first direction to face each other; and
a third non-display area and a fourth non-display area, which are spaced apart from each other in a second direction crossing the first direction to face each other, the heating wire being on the first to third non-display areas of the bottom surface.

5. The display device as claimed in claim 4, further comprising a cover member to cover an upper portion of the display panel corresponding to the fourth non-display area.

6. The display device as claimed in claim 1, wherein the heating wire is between the seat surface and the bottom surface of the display panel.

7. The display device of the claim 6, wherein the pad is on the outer surface.

8. The display device as claimed in claim 7, wherein the accommodation member includes a bottom part and a sidewall bent from the bottom part, the sidewall being combined with the mold member, and the outer surface and the seat surface face each other with the sidewall therebetween.

9. The display device as claimed in claim 1, wherein the heating wire is within the adhesion member, such that the adhesion member overlaps at least three surfaces of the heating wire.

10. The display device as claimed in claim 1, wherein the adhesion member includes a hot melt adhesive.

11. The display device as claimed in claim 1, wherein the display panel is curved to surround a central axis of the display panel.

12. A method for manufacturing a display device, the method comprising:
attaching an adhesion member to a seat surface of a mold member, the mold member further including an outer surface;
disposing a bottom surface of a display panel on the seat surface of the mold member to fix the bottom surface to the seat surface, the display panel further including a top surface facing the bottom surface in a normal direction;
supplying current to at least one heating wire contacting the adhesion member, the heating wire including a wire on the bottom surface of the display panel and a pad connected to a first end of the wire, the pad being bonded to be electrically connected to a first end of a flexible circuit board; and
combining the mold member with an accommodation member.

13. The method as claimed in claim 12, wherein:
a display area and a non-display area surrounding the display area are defined on the bottom surface of the display panel, and
the method further comprises patterning the heating wire on the bottom surface corresponding to the non-display area.

14. The method as claimed in claim 13, wherein supplying the current to the heating wire includes:
outputting the current from a driving circuit board; and
supplying the current output from the driving circuit board to the heating wire through the flexible circuit board,
wherein the flexible circuit board has a first end connected to the driving circuit board and a second end connected to the heating wire.

15. The method as claimed in claim 12, wherein the heating wire is injection-molded on the seat surface.

16. The method as claimed in claim 12, wherein the pad is disposed on an outer surface of the mold member.

17. The method as claimed in claim 16, wherein supplying the current to the one heating wire includes supplying the current from the outside through one end of the heating wire disposed on the outer surface.

18. The method as claimed in claim 12, wherein the adhesion member includes a hot melt adhesive.

19. The method as claimed in claim 12, wherein the display panel is curved to surround a central axis of the display panel.

* * * * *